US010366913B2

(12) United States Patent
Hamaguchi

(10) Patent No.: US 10,366,913 B2
(45) Date of Patent: Jul. 30, 2019

(54) METHOD FOR MANUFACTURING SEMICONDUCTOR ELEMENT AND METHOD FOR FORMING MASK PATTERN OF THE SAME

(71) Applicant: KABUSHIKI KAISHA TOSHIBA, Tokyo (JP)

(72) Inventor: Masafumi Hamaguchi, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 15/263,800

(22) Filed: Sep. 13, 2016

(65) Prior Publication Data

US 2017/0256629 A1 Sep. 7, 2017

Related U.S. Application Data

(60) Provisional application No. 62/303,247, filed on Mar. 3, 2016.

(51) Int. Cl.
*H01L 29/66* (2006.01)
*H01L 21/265* (2006.01)
(Continued)

(52) U.S. Cl.
CPC ...... *H01L 21/76224* (2013.01); *H01L 21/266* (2013.01); *H01L 21/26513* (2013.01);
(Continued)

(58) Field of Classification Search
CPC ................ H01L 21/027; H01L 21/266; H01L 29/66583; H01L 21/76224;
(Continued)

(56) References Cited

U.S. PATENT DOCUMENTS 7,913,214 B2 3/2011 Yamada
8,069,427 B2 11/2011 Yamada
(Continued)

OTHER PUBLICATIONS

Terence B. Hook et al. "Lateral Ion Implant Straggle and Mask Proximity Effect", IEEE Transactions of Electron Devices, vol. 50, No. 9 Sep. 2003 p. 1946-1951.
(Continued)

*Primary Examiner* — Timor Karimy
(74) *Attorney, Agent, or Firm* — Kim & Stewart LLP

(57) ABSTRACT

A method for manufacturing a semiconductor element includes forming a first region in a semiconductor region by ion-implanting impurities using a first mask; forming an interconnect including a gate portion extending in a first direction over the first region; and forming a source/drain region by ion-implanting impurities into a second region. A gate threshold voltage of the semiconductor element has first to third correlations dependent respectively on distances between an inner wall of the first mask and an outer edge of the second region, between the gate portion and the outer edge of the second region and between the outer edge of the second portion and a portion of the interconnect other than the gate portion. At least one of the distances is determined based on the first to third correlations to obtain a prescribed gate threshold voltage of the semiconductor element.

4 Claims, 13 Drawing Sheets

(51) Int. Cl.

| | |
|---|---|
| ***H01L 21/762*** | (2006.01) |
| ***H01L 21/266*** | (2006.01) |
| ***H01L 21/768*** | (2006.01) |
| ***H01L 29/78*** | (2006.01) |

(52) U.S. Cl.
CPC .. *H01L 21/26586* (2013.01); *H01L 21/76895* (2013.01); *H01L 29/66575* (2013.01); *H01L 29/7833* (2013.01)

(58) Field of Classification Search
CPC ......... H01L 21/26513; H01L 21/26586; H01L 21/76895; H01L 29/66575; H01L 29/7833
See application file for complete search history.

(56) References Cited

U.S. PATENT DOCUMENTS

| | | | | |
|---|---|---|---|---|
| 9,064,843 | B2 | 6/2015 | Hamaguchi | |
| 2007/0083842 | A1* | 4/2007 | Namba ............... | G06F 17/5072 257/208 |
| 2013/0056799 | A1* | 3/2013 | Ishizu ................. | G06F 17/5036 257/213 |

OTHER PUBLICATIONS

H. Aikawa et al. "Variability Aware Modeling and Characterization in Standard Cell in 45 nm CMOS with Stress Enhancement Technique", 2008 Symposium on VLSI Technology Digest of Technical Papers p. 90-91.

* cited by examiner

METHOD FOR MANUFACTURING SEMICONDUCTOR ELEMENT AND METHOD FOR FORMING MASK PATTERN OF THE SAME

CROSS-REFERENCE TO RELATED APPLICATIONS

This application is based upon and claims the benefit of priority from U.S. Provisional Patent Application 62/303,247 filed on Mar. 3, 2016; the entire contents of which are incorporated herein by reference.

FIELD

Embodiments are generally related to methods for manufacturing a semiconductor element and forming mask pattern of the same.

BACKGROUND

There are cases where a semiconductor integrated circuit includes multiple MOSFETs (Metal Oxide Semiconductor Field Effect Transistors) having mutually-different gate threshold voltages. For example, such MOSFETs are provided on P-type or N-type wells having different carrier concentrations corresponding to the gate threshold voltages of the MOSFETs. However, to form the multiple wells having different carrier concentrations, it is necessary to perform ion implantation multiple times and use ion implantation masks having different patterns in the ion implantation processes. Therefore, the manufacturing efficiency of the semiconductor integrated circuit decreases; and the cost of the semiconductor integrated circuit increases.

DETAILED DESCRIPTION

Figure 1:
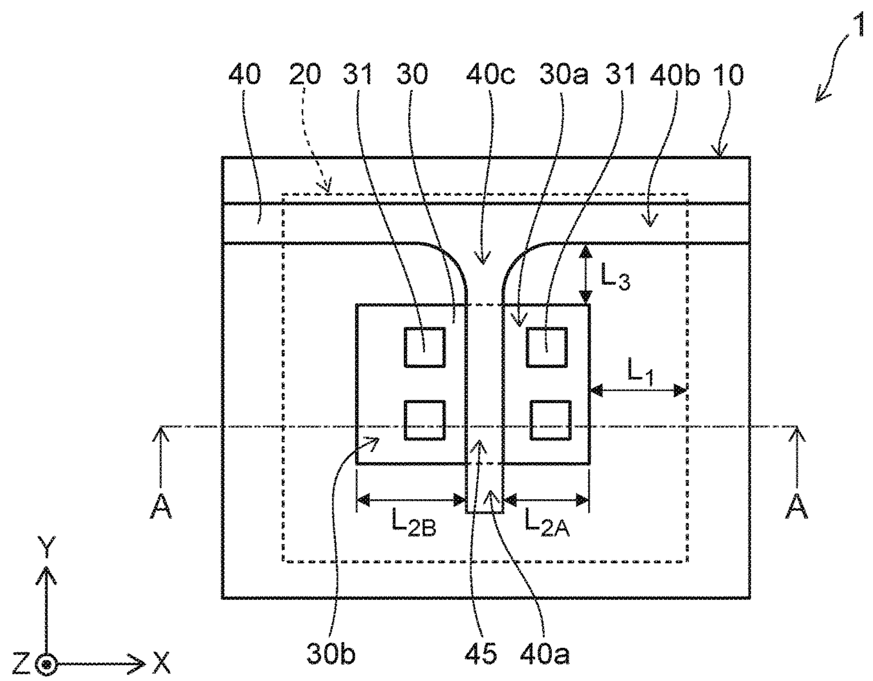
FIG. 1 is a schematic view showing a semiconductor element according to a first embodiment.

According to an embodiment, a method for manufacturing a semiconductor element includes forming a first region of a first conductivity type in a semiconductor region by selectively ion-implanting impurities of the first conductivity type using a first mask provided on the semiconductor region, the first mask having a first opening, the first region being exposed at a bottom surface of the first opening; forming an interconnect including a gate portion extending in a first direction over the first region; and forming a source and a drain by ion-implanting impurities of a second conductivity type into a second region, the second region being positioned on two sides of the gate portion in the first region. A gate threshold voltage of the semiconductor element has a first correlation dependent on a first distance to an inner wall of the first opening from an outer edge of the second region proximal to the inner wall of the first opening, a second correlation dependent on a second distance from the outer edge of the second region to the gate portion in a second direction intersecting the first direction, a third correlation dependent on a third distance in one of the first direction and the second direction to the outer edge of the second region from a portion of the interconnect positioned outside the second region, and a fourth correlation dependent on a fourth distance when impurities of the first conductivity type are selectively ion-implanted under the gate portion using a second mask provided on the semiconductor region. The fourth distance is a distance to an inner wall of a second opening of the second mask from the outer edge of the second region proximal to the inner wall of the second opening. At least one of the first distance, the second distance, the third distance, and the fourth distance is determined based on the first correlation, the second correlation, the third correlation and the fourth correlation to obtain a prescribed gate threshold voltage of the semiconductor element.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic view showing a semiconductor element 1 according to a first embodiment. The semiconductor element 1 is, for example, an N-type MOSFET provided on a semiconductor region 10. For example, the semiconductor region 10 is of the P-type. The semiconductor region 10 may be a semiconductor substrate or may be an impurity doped region formed on a semiconductor substrate.

The semiconductor element 1 is provided in a first region 20 of the semiconductor region 10 on a top surface side thereof. For example, a P-type well 23 (referring to FIG. 2C) is provided in the first region 20. The semiconductor element 1 includes a second region 30 provided in the first region 20 and an interconnect 40. For example, the second region 30 is surrounded with an insulating layer (hereinbelow, the Shallow trench isolation: STI 50) provided in the semiconductor region 10 on the top surface side. The interconnect 40 is provided on the semiconductor region 10 and extends in a first direction (hereinbelow, a Y-direction) on the second region 30. The interconnect 40 includes a gate portion 45.

Figures 2A, 2B, 2C:
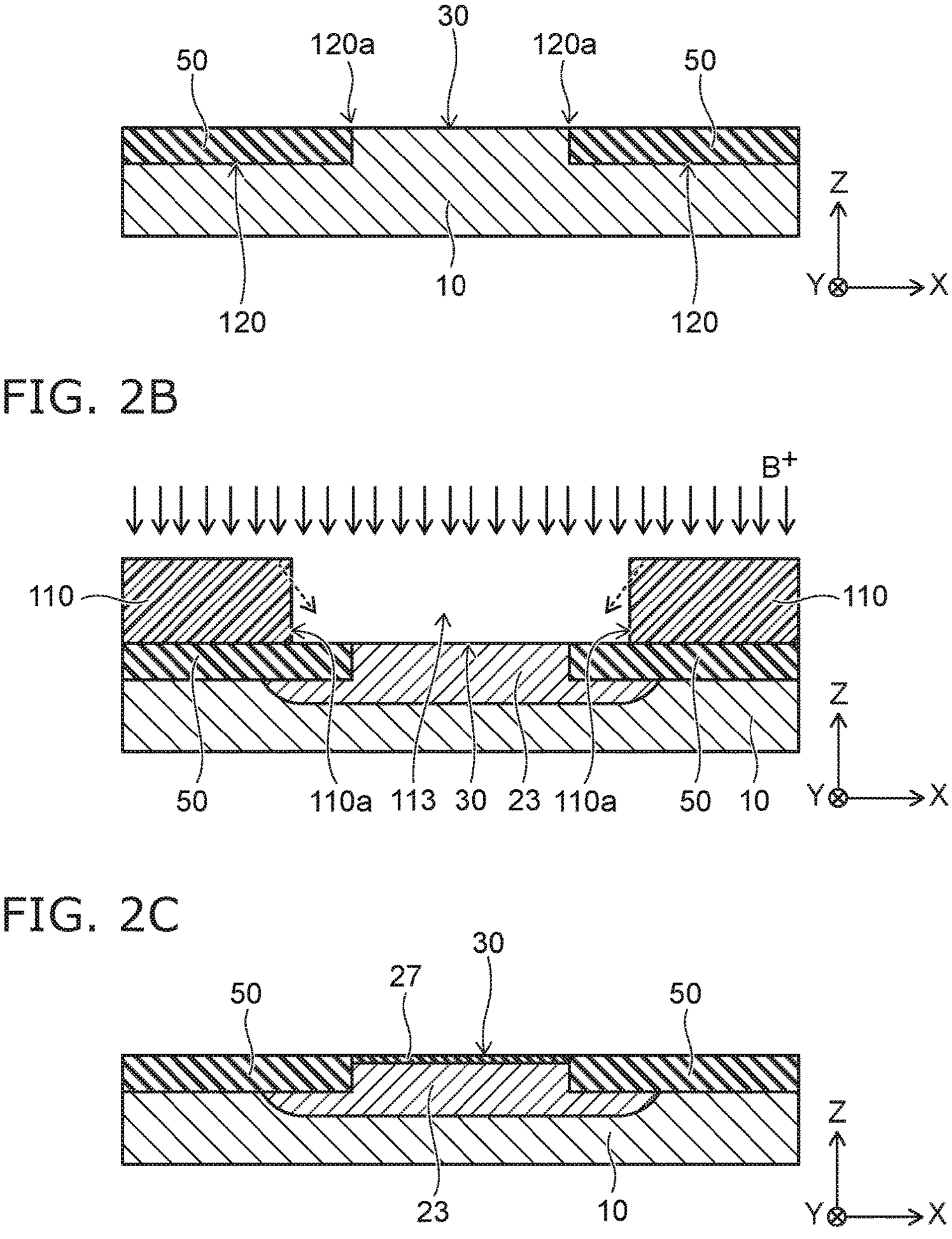
FIGS. 2A to 2I are schematic cross-sectional views showing a manufacturing process of the semiconductor element according to the first embodiment.
Figure 2D:
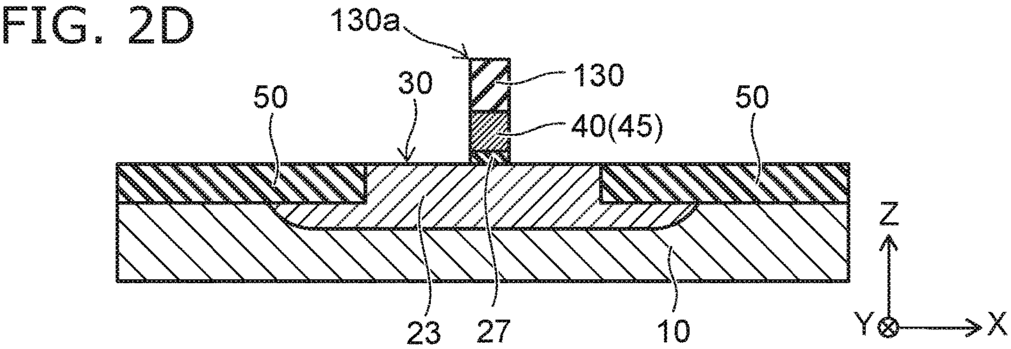
Figure 2E:
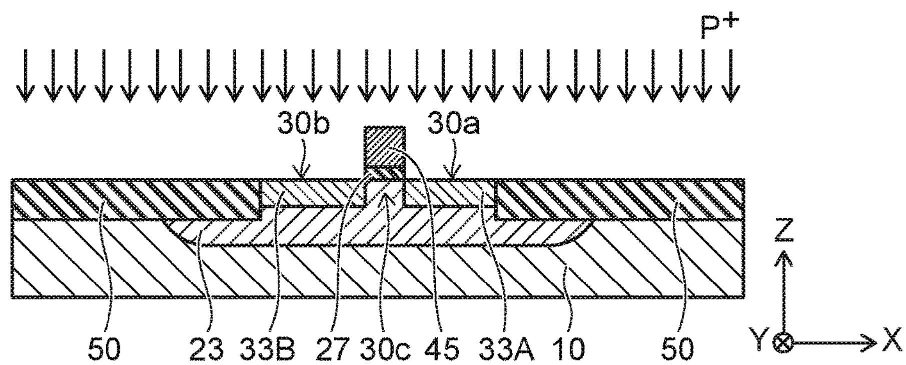

The second region 30 includes a first portion 30*a*, a second portion 30*b*, and a channel portion 30*c* that is under the gate portion 45 (referring to FIG. 2E). The first portion 30*a* is positioned on one side of the gate portion 45 in a second direction. The second direction is a direction intersecting the Y-direction and is described as an X-direction hereinbelow. The second portion 30*b* is positioned on the other side of the gate portion 45 in the X-direction. For example, N-type source/drain regions 33A and 33B are provided in the first portion 30*a* and the second portion 30*b* (referring to FIG. 2F). Further, contact parts 31 are provided in the first portion 30*a* and the second portion 30*b*. The contact parts 31 include the N-type impurity with a higher concentration than the N-type source/drain regions 33A and 33B.

For example, the gate threshold voltage of the semiconductor element 1 has a first correlation that is dependent on a first distance $L_1$ from the outer edge of the first region 20 to the outer edge of the second region 30, a second correlation that is dependent on second distances $L_{2A}$ and $L_{2B}$ from the outer edge of the second region 30 to the gate portion 45, and a third correlation that is dependent on a third distance $L_3$ from the interconnect 40 to the second region 30.

The first distance $L_1$ is, for example, the distance between the outer edge of the first region 20 and the outer edge of the second region 30 that is the proximal outer edge of the first region 20. Also, the first distance $L_1$ may be the shortest distance between the outer edge of the first region 20 and the outer edge of the second region 30. Here, the "proximal outer edge" means, for example, a side that is at the position most proximal to one of the four sides defining the first region 20 in FIG. 1.

The second distances $L_{2A}$ and $L_{2B}$ are, for example, the distances in the X-direction from the outer edges of the second region 30 extending in the Y-direction to the gate portion 45, i.e., the widths in the X-direction of the first portion 30*a* and the second portion 30*b*.

The third distance $L_3$ is, for example, the distance to the outer edge of the second region 30 from the portion of the interconnect 40 positioned outside the second region 30. In the example shown in FIG. 1, the interconnect 40 has a first portion 40*a* extending in the Y-direction and including the gate portion 45, and a second portion 40*b* extending in the X-direction outside the second region 30. The first portion 40*a* is linked to the second portion 40*b* by a connection portion 40*c*. In such a case, the third distance $L_3$ is the distance in the Y-direction between the second region 30 and the second portion 40*b* at the position separated from the connection portion 40*c*.

In the manufacturing processes of the semiconductor element 1, the first distance $L_1$, the second distances $L_{2A}$ and $L_{2B}$, and the third distance $L_3$ are set so that the gate threshold voltage is set to a prescribed value or is set to be within a prescribed range. Thereby, the multiple semiconductor elements 1 that have mutually-different gate threshold voltages can be obtained without forming multiple P-type wells that have different carrier concentrations.

A method for manufacturing the semiconductor element 1 according to the embodiment will now be described with reference to FIGS. 2A to 2I. FIGS. 2A to 2I are schematic cross-sectional views showing the manufacturing processes of the semiconductor element 1 according to the embodiment. FIGS. 2A to 2I are cross-sectional views along line A-A shown in FIG. 1.

As shown in FIG. 2A, the STI 50 is formed on the semiconductor region 10. The STI 50 is, for example, a silicon oxide layer. For example, the STI 50 is embedded in a recess portion 120 provided in the top surface of the semiconductor region 10. The edges of the STI 50 define the second region 30. In other words, the edges of the STI 50 have the configuration of a source/drain pattern 120*a* in the top view of the semiconductor region 10.

As shown in FIG. 2B, an ion implantation mask 110 is formed on the semiconductor region 10. The ion implantation mask 110 is, for example, a photosensitive resist layer and has an opening 113 formed using photolithography. The opening 113 has the configuration of a well pattern 110*a* defining the first region 20 when viewed in the top view. Also, the second region 30 is exposed at the bottom surface of the opening 113.

Then, the P-type well 23 is formed, for example, by ion-implanting boron (B) which is a P-type impurity. By using the ion implantation mask 110, P-type impurities are selectively implanted into the first region 20. At this time, a part of the P-type impurities travels along the direction changed in the ion implantation mask 110 surrounding the opening 113; and the part of the P-type impurities passes through the wall surface of the opening 113 and reaches the bottom surface of the opening 113 on the inner wall side thereof. Therefore, the concentration of the P-type impurity of the P-type well 23 increases toward the wall surface of the opening 113. Also, the P-type impurity in the P-type well 23 has a distribution in which the surface concentration increases toward the outer edge from the center thereof.

As shown in FIG. 2C, an insulating layer 27 is formed on the top surface of the second region 30. The insulating layer 27 is, for example, a silicon oxide layer made by thermal oxidation of the P-type well 23.

As shown in FIG. 2D, the interconnect 40 that includes the gate portion 45 is formed on the insulating layer 27 and the STI 50 (referring to FIG. 1). For example, a conductive layer is formed so as to cover the insulating layer 27 and the STI 50; and subsequently, the interconnect 40 is formed by removing the conductive layer selectively using an etching mask 130. Further, the insulating layer 27 is selectively removed using the etching mask 130. The etching mask 130 is, for example, a silicon oxide layer and has the configuration of an interconnect pattern 130*a* when viewed in the top view. The gate portion 45 is formed on the P-type well 23 with the insulating layer 27 interposed. The gate portion 45 extends in the Y-direction.

As shown in FIG. 2E, for example, the N-type source/drain regions 33A and 33B are formed by ion-implanting phosphorus (P) that is an N-type impurity. The N-type source/drain regions are formed in the first portion 30*a* and the second portion 30*b* of the second region 30 positioned on both sides of the gate portion 45. The channel portion 30*c* is formed under the gate portion 45; and the insulating layer 27 acts as a gate insulating film.

Figure 2F:
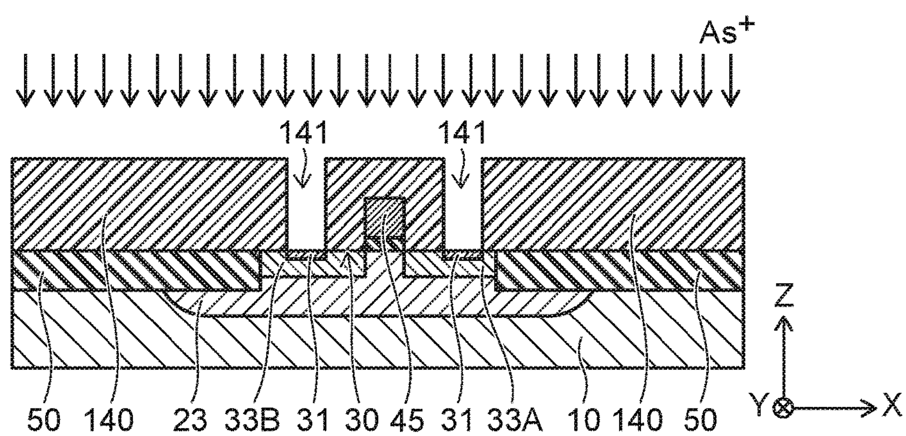

As shown in FIG. 2F, for example, the contact parts 31 are formed by selectively ion-implanting arsenic (As) that is an N-type impurity into the top surface of the second region 30. The contact parts 31 include the N-type impurity with a higher concentration than the source/drain regions 33A and 33B.

For example, an ion implantation mask 140 that covers the second region 30, the interconnect 40, and the STI 50 is formed. The ion implantation mask 140 is, for example, a photosensitive resist layer and has an opening 141 formed using photolithography. The opening 141 communicates with the second region 30. Then, the contact parts 31 are formed in the second region 30 by selectively ion-implanting the N-type impurity using the ion implantation mask 140.

Figure 2G:
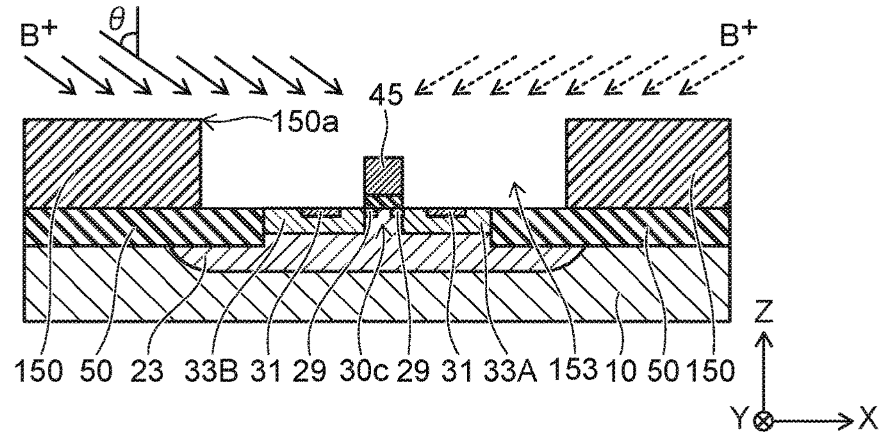

As shown in FIG. 2G, a P-type region 29 is formed in the channel portion 30*c* under the gate portion 45. The P-type region 29 includes the P-type impurity with a higher concentration than the P-type impurity concentration at the top surface of the channel portion 30*c*. For example, the P-type region 29 is formed under the gate portion 45 by implanting boron (B) that is a P-type impurity. The P-type region 29 is formed by oblique ion implantation in which an implantation angle θ is set to be larger. For example, this process is selectively implemented using an ion implantation mask 150 formed on the STI 50. The ion implantation mask 150 is, for example, a photosensitive resist layer and has an opening 153 formed using photolithography. The opening 153 has a bottom surface that exposes the gate portion 45 provided on the channel portion 30*c* where the P-type region 29 is to be formed.

Figure 2H:
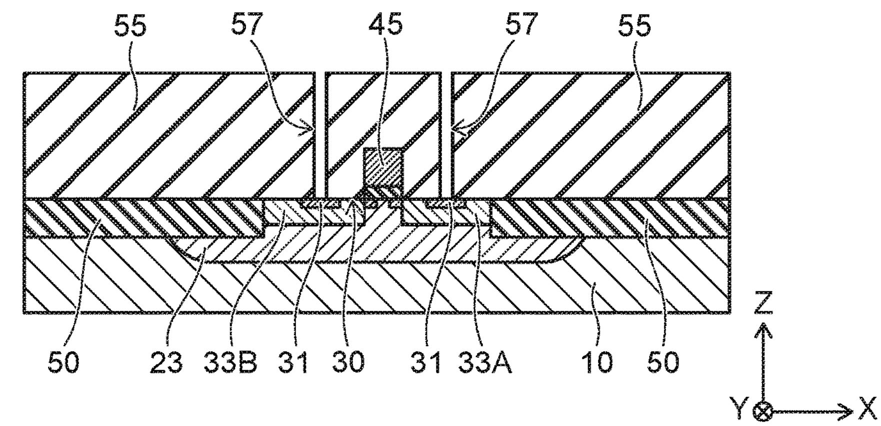

As shown in FIG. 2H, an insulating layer 55 is formed so as to cover the second region 30, the interconnect 40, and the STI 50; and contact holes 57 that communicate with the contact parts 31 are formed from the upper surface of the insulating layer 55. The insulating layer 55 is, for example, a silicon oxide layer.

Figure 2I:
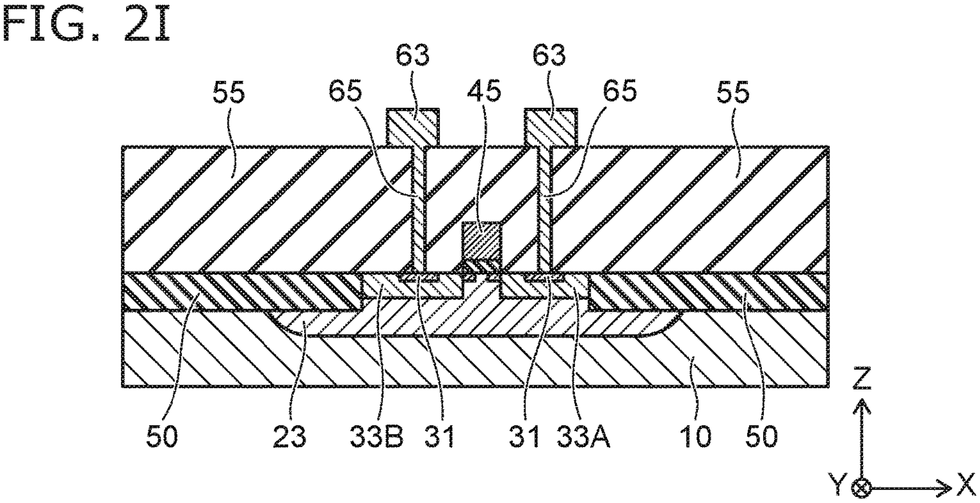

As shown in FIG. 2I, interconnects 63 are formed on the insulating layer 55. For example, the interconnects 63 are electrically connected via contact plugs 65 to the contact parts 31 respectively. The contact plugs 65 are formed in the contact holes 57. Also, a gate interconnect (not-shown) is formed on the insulating layer 55 and electrically connected to the gate portion 45.

The relationship between the mask patterns and a gate threshold voltage Vt of the semiconductor element 1 according to the embodiment will now be described with reference to FIGS. 3A to 7C, wherein the gate threshold voltage Vt depends on the distance between the mask patterns. FIGS. 3A to 7C are graphs and schematic views showing the relationship between the gate threshold voltage Vt and the distance between the mask patterns.

Figure 3A:
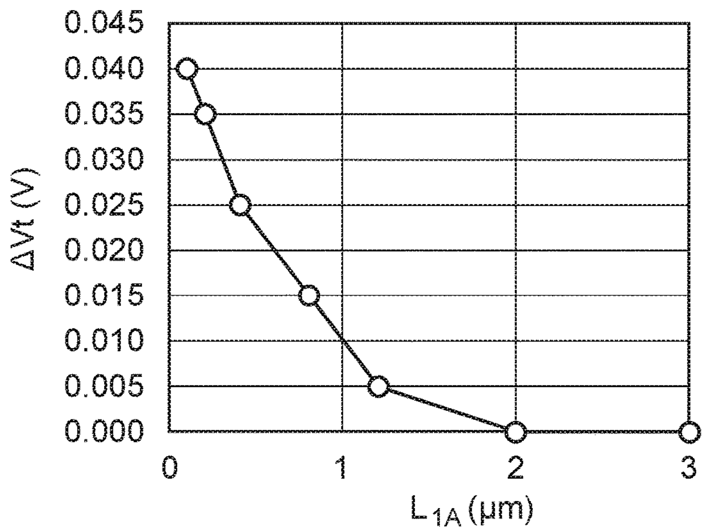
FIGS. 3A to 7C are graphs and schematic views showing relationships of a gate threshold voltage in the semiconductor element and a distance between mask patterns according to the first embodiment.

FIG. 3A is a graph showing the first correlation between a first distance $L_{1A}$ and the gate threshold voltage Vt. The horizontal axis is the first distance $L_{1A}$ (μm); and the vertical axis is a change amount ΔVt (V) of the gate threshold voltage Vt.

Figure 3B:
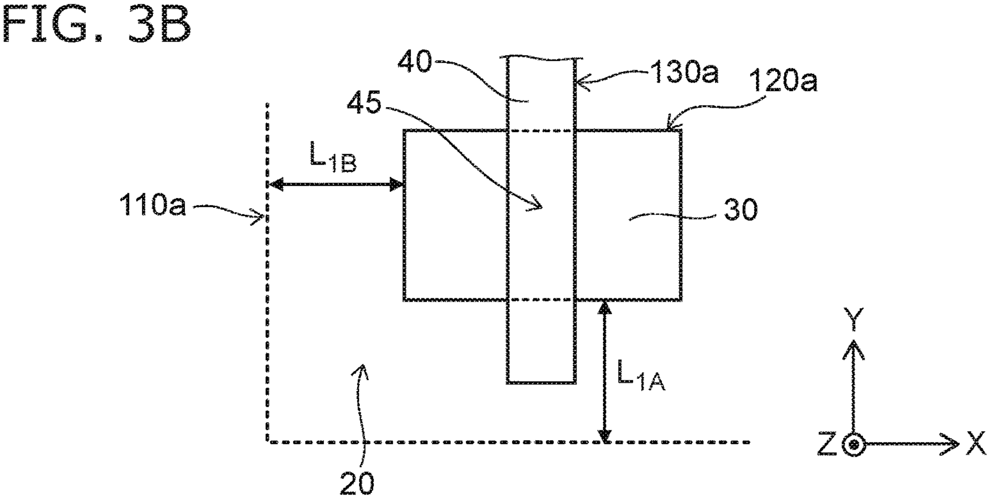

FIG. 3B shows the positional relationship of the mask patterns of the semiconductor element 1. FIG. 3B includes the well pattern 110*a*, the source/drain pattern 120*a*, and the interconnect pattern 130*a*. The well pattern 110*a* matches the outer edge of the first region 20; and the source/drain pattern 120*a* matches the outer edge of the second region 30. The interconnect pattern 130*a* shows the interconnect 40.

The first distance $L_{1A}$ is the distance in the Y-direction between the outer edge of the first region 20 extending in the X-direction and the outer edge of the second region 30 proximal to the outer edge of the first region 20. In other words, the first distance $L_{1A}$ is the shortest distance in the Y-direction from the second region 30 to the outer edge of the first region 20.

As shown in FIG. 3A, the change amount ΔVt of the gate threshold voltage Vt increases as the first distance $L_{1A}$ shortens. It can be seen that the surface concentration of the P-type impurity of the P-type well 23 increases toward the outer edge of the first region 20 from the center thereof. Therefore, as the first distance $L_{1A}$ shortens, the concentration of the P-type impurity of the channel portion 30*c* under the gate portion 45 (referring to FIG. 2E) increases; and the gate threshold voltage Vt increases. This correlation is the same for a first distance $L_{1B}$ as well. The first distance $L_{1B}$ is the distance in the X-direction from the outer edge extending in the Y-direction of the first region 20 to the outer edge of the second region 30 that is proximal to the outer edge extending in the Y-direction of the first region 20. In other words, the first distance $L_{1B}$ is the shortest distance in the X-direction from the second region 30 to the outer edge of the first region 20.

On the other hand, in the case where the semiconductor element 1 is a P-type MOSFET, an N-type well is provided in the first region 20. The gate threshold voltage of the P-type MOSFET is a negative voltage. The surface concentration of the N-type impurity of the N-type well increases toward the outer edge of the first region 20 from the center thereof. Accordingly, the gate threshold voltage Vt of the semiconductor element 1 decreases as the first distance $L_{1A}$ shortens. In other words, as the first distance $L_{1A}$ shortens, the absolute value |ΔVt| of the change amount of the gate threshold voltage increases; and the absolute value |Vt| of the gate threshold voltage increases. In other words, the absolute value |Vt| of the gate threshold voltage of the semiconductor element 1 has the first correlation of increasing as the first distances $L_{1A}$ and $L_{1B}$ shorten.

Figure 4A:
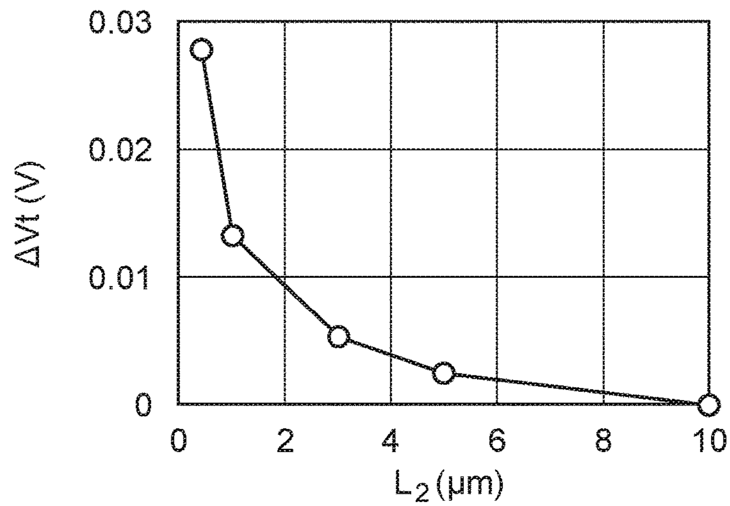

FIG. 4A is a graph showing the second correlation between the gate threshold voltage Vt and the second distances $L_{2A}$ and $L_{2A}$. The horizontal axis is the second distance $L_2$ (μm); and the vertical axis is the change amount ΔVt (V) of the gate threshold voltage Vt.

Figure 4B:
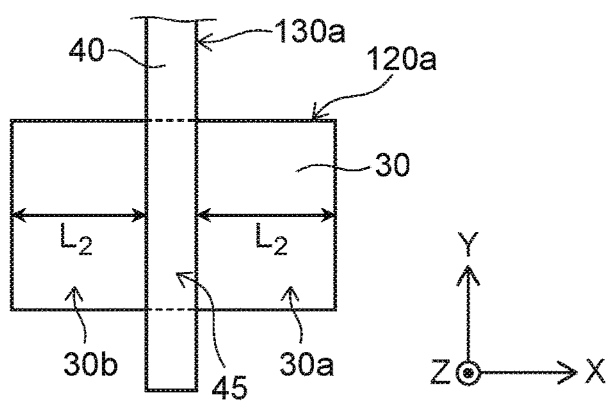
Figure 4C:
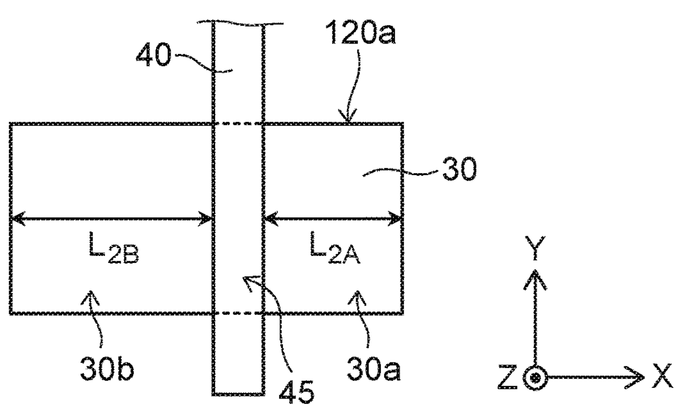

FIG. 4B and FIG. 4C include the source/drain pattern 120*a* and the interconnect pattern 130*a*. The source/drain pattern 120*a* matches the outer edge of the second region 30. The interconnect pattern 130*a* shows the interconnect 40 including the gate portion 45.

As shown in FIG. 4B, the second distance $L_2$ is the distance in the X-direction from the outer edge extending in the Y-direction of the second region 30 to the gate portion 45. Also, the second distance $L_2$ is the width in the X-direction of the first portion 30*a* and the second portion 30*b* in the second region 30. In the example, the second region 30 is provided with line symmetry having the axis on the center of the gate portion 45. Accordingly, both the width of the first portion 30*a* and the width of the second portion 30*b* are equal to the second distance $L_2$.

As shown in FIG. 4A, the gate threshold voltage Vt has the second correlation that is dependent on the second distance $L_2$; and it can be seen that the change amount ΔVt of the gate threshold voltage increases as the second distance $L_2$ shortens. It is considered that this is a change caused by the stress generated due to the difference of the linear thermal expansion coefficients between the semiconductor region 10 and the STI 50 surrounding the second region 30. For example, as the second distance $L_2$ shortens, the stress that is applied to the channel portion 30*c* under the gate portion 45 increases; and the gate threshold voltage Vt increases.

The correlation shown in FIG. 4A shows an example in which the extension direction of the gate portion 45 (the Y-direction) of the N-type MOSFET is set to match the <100> direction of the silicon crystal. Also, in the N-type MOSFET, for example, even in the case where the extension direction of the gate portion 45 is set to match the <110> direction of the silicon crystal, the gate threshold voltage Vt has the correlation of increasing as the second distance $L_2$ is shortened.

On the other hand, in the P-type MOSFET, in the case where the extension direction of the gate portion 45 is set to match the <100> direction of the silicon crystal, it is known that the gate threshold voltage Vt does not fluctuate even in the case where the second distance $L_2$ is changed. Also, in the P-type MOSFET, in the case where the extension direction of the gate portion 45 is set to match the <110> direction of the silicon crystal, the gate threshold voltage Vt decreases as the second distance $L_2$ is shortened. In other words, the gate threshold voltage Vt has the second correlation in which the absolute value $|\Delta Vt|$ of the change amount of the gate threshold voltage increases as the second distance $L_2$ shortens.

In the example shown in FIG. 4C, the second region 30 is provided asymmetrically with respect to the gate portion 45. Also, the gate threshold voltage Vt has a correlation that is dependent on at least one of the second distance $L_{2A}$ or $L_{2B}$. The second distance $L_{2A}$ is the distance in the X-direction to the gate portion 45 from the outer edge extending in the Y-direction of the first portion 30*a* of the second region 30. In other words, the second distance $L_{2A}$ is the width in the X-direction of the first portion 30*a* of the second region 30. Also, the second distance $L_{2B}$ is the distance in the X-direction to the gate portion 45 from the outer edge extending in the Y-direction of the second portion 30*b* of the second region 30. The second distance $L_{2B}$ is the width in the X-direction of the second portion 30*b* of the second region 30. For example, the change amount $\Delta Vt$ of the gate threshold voltage Vt has another second correlation in which one of the second distance $L_{2A}$ or $L_{2B}$ is fixed, and the change amount $\Delta Vt$ increases as the other of the second distance $L_{2A}$ or $L_{2B}$ is shortened. For example, there are also cases where the change amount $\Delta Vt$ has a correlation in which the change amount $\Delta Vt$ increases as both the second distances $L_{2A}$ and $L_{2B}$ are shortened.

Figure 5A:
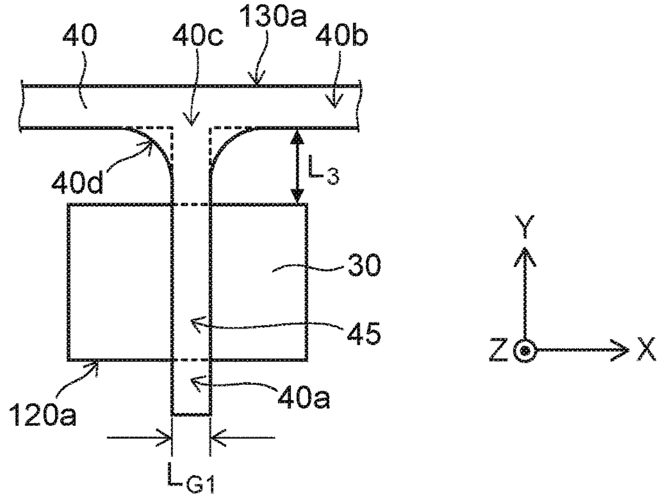

FIG. 5A shows the source/drain pattern 120*a* and the interconnect pattern 130*a*. The source/drain pattern 120*a* matches the outer edge of the second region 30. The interconnect pattern 130*a* shows the interconnect 40. The interconnect 40 includes the first portion 40*a*, the second portion 40*b*, and the connection portion 40*c*. The first portion 40*a* extends in the Y-direction and includes the gate portion 45. The second portion 40*b* extends in the X-direction outside the second region 30. The first portion 40*a* is linked to the second portion 40*b* by the connection portion 40*c*.

As shown in FIG. 5A, the connection portion 40*c* has an outer edge 40*d* having a curvature. For example, even in the case where the first portion 40*a* and the second portion 40*b* have sides which intersect at a right angle in the interconnect pattern 130*a*, the connection portion 40*c* is formed to have a curvature in the outer edge 40*d* caused by the characteristics of manufacturing processes such as photolithography, etching, etc. Also, the third distance $L_3$ is defined at a position separated from the outer edge 40*d* that has the curvature. The third distance $L_3$ is, for example, the distance from the second portion 40*b* of the interconnect 40 to the outer edge of the second region 30 proximal to the second portion 40*b*. In the example, the third distance $L_3$ is the distance in the Y-direction from the second portion 40*b* of the interconnect 40 to the second region 30.

Figure 5B:
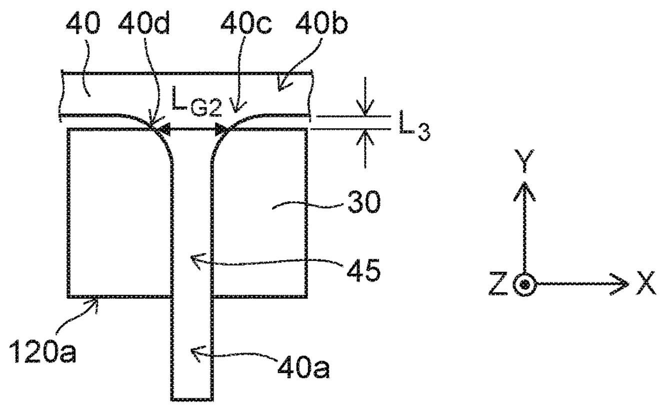
Figure 5C:
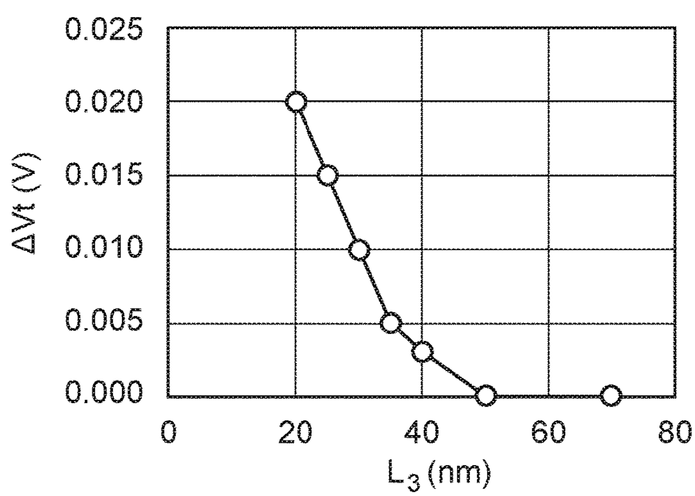

FIG. 5B shows the second region 30 and the interconnect 40 in the case where the third distance $L_3$ is set to be short. FIG. 5C is a graph showing the change amount $\Delta Vt$ of the gate threshold voltage with respect to the third distance $L_3$. The horizontal axis is the third distance $L_3$ (nm); and the vertical axis is the change amount $\Delta Vt$ (V). As shown in FIG. 5C, it can be seen that the change amount $\Delta Vt$ of the gate threshold voltage Vt increases as the third distance $L_3$ shortens.

For example, as shown in FIG. 5A, in the case where the third distance $L_3$ is long and the connection portion 40*c* of the interconnect 40 is separated from the second region 30, the gate length of the gate portion 45 is a width $L_{G1}$ in the X-direction of the first portion 40*a* of the interconnect 40.

In contrast, as shown in FIG. 5B, when the portion of the connection portion 40*c* including the outer edge 40*d*, which has the curvature, overlaps the second region 30, the gate length of the gate portion 45 becomes $L_{G2}$ that is longer than $L_{G1}$ on the second portion 40*b* side. The gate length becomes longer as the third distance $L_3$ shortens. For example, the gate threshold voltage Vt of the N-type MOSFET increases as the gate length becomes longer. Accordingly, the change amount $\Delta Vt$ of the gate threshold voltage Vt increases as the third distance $L_3$ shortens as shown in FIG. 5C, where the change amount $\Delta Vt$ is shown with respect to the third distance $L_3$ based on the gate threshold voltage Vt in the case shown in FIG. 5A. In other words, the gate threshold voltage Vt of the N-type MOSFET has the third correlation that is dependent on the third distance $L_3$; and the gate threshold voltage Vt increases as the third distance $L_3$ shortens.

Figure 6A:
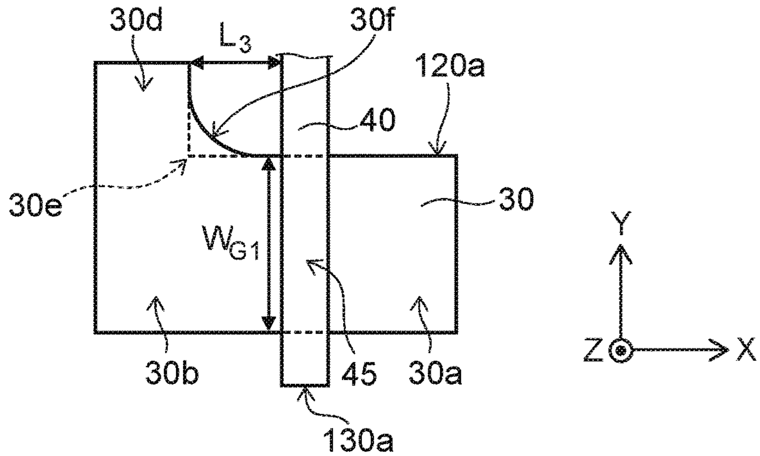

FIG. 6A shows the source/drain pattern 120*a* and the interconnect pattern 130*a*. The second region 30 further has a third portion 30*d* that is linked to the first portion 30*a* or the second portion 30*b*. For example, the third portion 30*d* extends in the Y-direction. As shown in FIG. 6, for example, the second region 30 has a connection portion 30*e* at the position where the third portion 30*d* is linked to the second portion 30*b*. Also, the connection portion 30*e* has an outer edge 30*f* having a curvature. On the other hand, the interconnect pattern 130*a* shows the interconnect 40. The interconnect 40 extends in the Y-direction and includes the gate portion 45.

For example, in the source/drain pattern 120*a* as shown in FIG. 6A, even in the case where the second portion 30*b* and the third portion 30*d* have sides which intersect at a right angle, the connection portion 30*e* is formed to have a curvature at the outer edge 30*f* of the connection portion 30*e* caused by the characteristics of processes such as photolithography, diffusion, etc. Also, the third distance $L_3$ is defined at a position separated from the outer edge 30*f*. The third distance $L_3$ is, for example, the distance from the interconnect 40 to the third portion 30*d* of the second region 30.

Figure 6B:
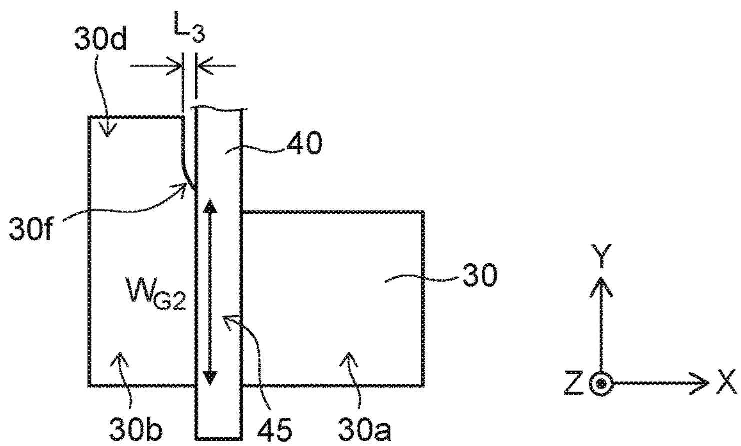
Figure 6C:
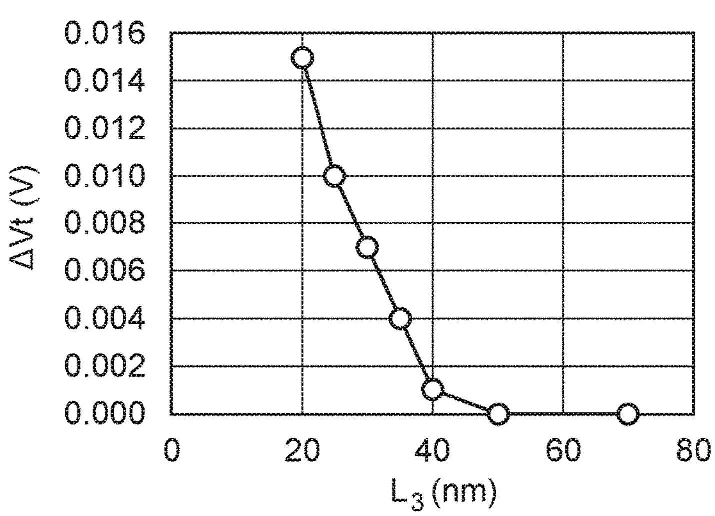

FIG. 6B shows the second region 30 and the interconnect 40 in the case where the third distance $L_3$ is set to be short. FIG. 6C is a graph showing the change amount $\Delta Vt$ of the gate threshold voltage Vt with respect to the third distance $L_3$. The horizontal axis is the third distance $L_3$ (nm); and the vertical axis is the change amount $\Delta Vt$ (V). As shown in FIG. 6C, it can be seen that the change amount $\Delta Vt$ of the gate threshold voltage Vt increases as the third distance $L_3$ shortens.

For example, as shown in FIG. 6A, in the case where the third distance $L_3$ is long and the interconnect 40 is separated from the connection portion 30*e* of the second region 30, the gate portion 45 has a gate width $W_{G1}$ in the Y-direction between the first portion 30*a* and the second portion 30*b* of the second region 30.

In contrast, as shown in FIG. 6B, when the connection portion 30*e* overlaps the interconnect 40, the gate width of the gate portion 45 becomes $W_{G2}$ that is longer than $W_{G1}$ on the third portion 30*d* side. The gate width widens as the third distance $L_3$ shortens. Also, the gate threshold voltage Vt of the N-type MOSFET increases as the gate width widens. Therefore, the change amount ΔVt of the gate threshold voltage Vt increases as the third distance $L_3$ shortens as shown in FIG. 6C, where the change amount ΔVt is shown based on the gate threshold voltage Vt in the case shown in FIG. 6A. Therefore, the gate threshold voltage Vt of the N-type MOSFET has another third correlation that is dependent on the third distance $L_3$; and the gate threshold voltage Vt increases as the third distance $L_3$ shortens.

Such a third correlation occurs in a P-type MOSFET as well. In other words, the gate threshold voltage Vt of the P-type MOSFET decreases as the third distance $L_3$ shortens. As a result, the change amount ΔVt of the gate threshold voltage Vt becomes small. For example, as the third distance shortens in the P-type MOSFET, the absolute value of the gate threshold voltage Vt increases; and the absolute value of the change amount ΔVt increases.

The correlation between the third distance $L_3$ and the change amount ΔVt of the gate threshold voltage Vt recited above is an example and is not limited thereto. For example, the correlation between the change amount ΔVt and the third distance $L_3$ may be reversed due to modifications to the design of the semiconductor element or the wafer process conditions. Even in such a case, the gate threshold voltage Vt can be changed by the third distance $L_3$.

Figure 7A:
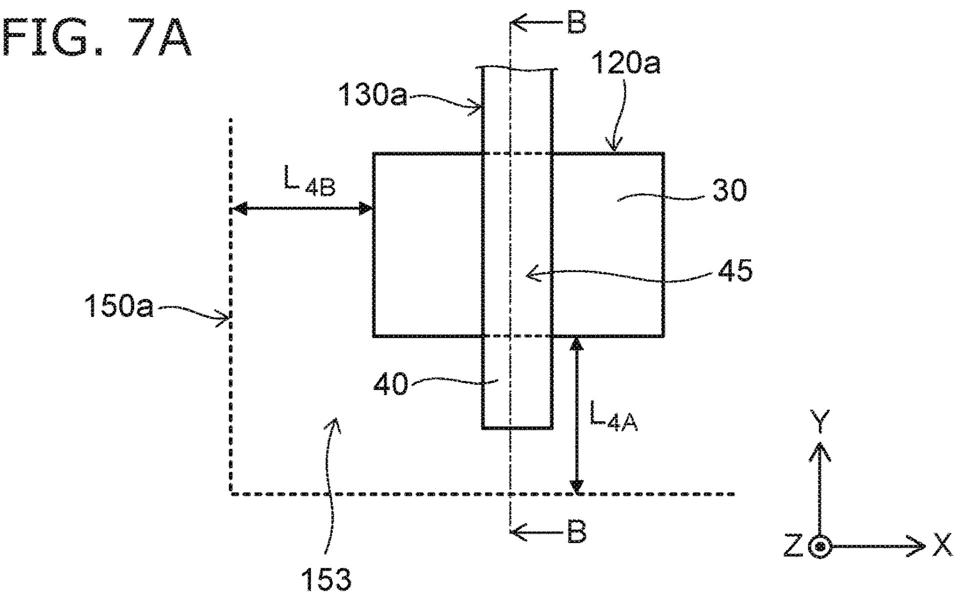

FIG. 7A shows the source/drain pattern 120*a*, the interconnect pattern 130*a*, and an ion implantation pattern 150*a*. The source/drain pattern 120*a* matches the outer edge of the second region 30; and the interconnect pattern 130*a* shows the interconnect 40. The ion implantation pattern 150*a* matches the opening 153 of the ion implantation mask 150. The ion implantation mask 150 is used when ion-implanting the P-type impurity into the channel portion 30*c* under the gate portion 45 (referring to FIG. 2G).

The gate threshold voltage Vt has a fourth correlation that is dependent on a fourth distance from the inner wall of the opening 153 to the second region 30. The fourth distance is, for example, the distance from the inner wall of the opening 153 to the outer edge of the second region 30 proximal to the inner wall of the opening 153. Also, the fourth distance is the shortest distance from the inner wall of the opening 153 to the second region 30.

In the example, fourth distances $L_{4A}$ and $L_{4B}$ are defined. As shown in FIG. 7A, the fourth distance $L_{4A}$ is the distance in the Y-direction from the outer edge extending in the X-direction of the second region 30 to the inner wall of the opening 153 proximal to the outer edge extending in the X-direction of the second region 30. The fourth distance $L_{4B}$ is the distance in the X-direction from the outer edge extending in the Y-direction of the second region 30 to the inner wall of the opening 153 proximal to the outer edge extending in the Y-direction of the second region 30.

Figure 7B:
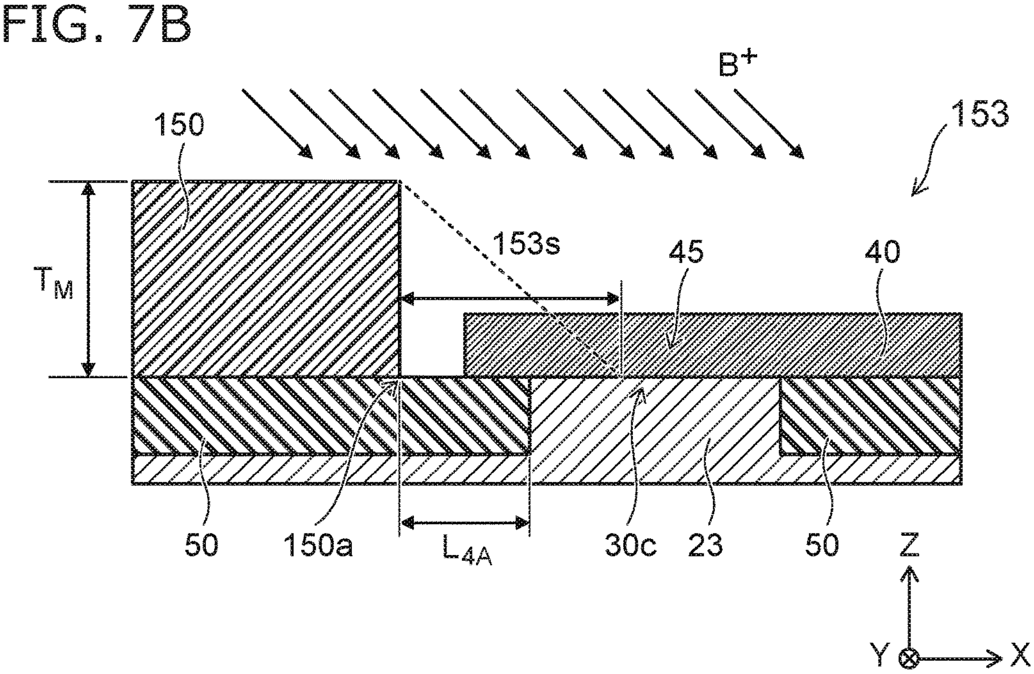
Figure 7C:
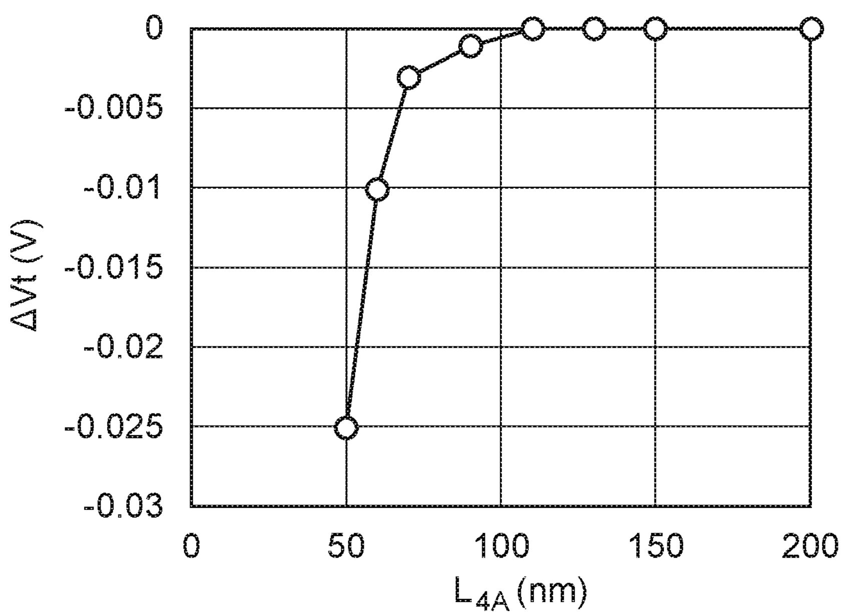

FIG. 7B is a partial cross-sectional view of the semiconductor element along line B-B shown in FIG. 7A. FIG. 7C is a graph showing the change amount ΔVt of the gate threshold voltage with respect to the fourth distance $L_{4A}$. The horizontal axis is the fourth distance $L_{4A}$ (nm); and the vertical axis is the change amount ΔVt (V).

As shown in FIG. 7B, the ion implantation mask 150 is provided on the STI 50. Then, boron (B) which is a P-type impurity is ion-implanted from an oblique direction into the second region 30 exposed at the opening 153 of the ion implantation mask 150. Thereby, the P-type region 29 is formed in the channel portion 30*c* positioned under the gate portion 45 (referring to FIG. 2G); and the gate threshold voltage Vt is increased.

On the other hand, a shadow region 153*s* that is caused by a thickness $T_M$ of the ion implantation mask 150 occurs at the vicinity of the inner wall of the ion implantation mask 150. In other words, in the shadow region 153*s*, the P-type impurity is shielded; and the dose amount thereof is decreased. As shown in FIG. 7B, the P-type impurity concentration of the P-type region 29 decreases in the case where the fourth distance $L_{4A}$ shortens and the shadow region 153*s* overlaps the channel portion 30*c*. Thereby, the increase of the gate threshold voltage Vt is suppressed. Also, as the thickness $T_M$ of the ion implantation mask 150 increases, the shadow region 153*s* spreads; and the increase of the gate threshold voltage Vt is suppressed.

As shown in FIG. 7C, the gate threshold voltage Vt has the fourth correlation that is dependent on the fourth distance $L_{4A}$. FIG. 7C shows the change amount ΔVt of the gate threshold voltage with respect to the gate threshold voltage Vt in the case where the shadow region 153*s* does not overlap the channel portion 30*c*. In other words, as the fourth distance $L_{4A}$ shortens, the overlap of the shadow region 153*s* over the channel portion 30*c* is widened; and the increase of the gate threshold voltage Vt is suppressed. Such a fourth correlation occurs similarly for the fourth distance $L_{4A}$ as well.

In the P-type MOSFET, the N-type impurity is ion-implanted into the channel portion 30*c*; and an N-type region is formed so as to have a higher concentration than the concentration of the N-type impurity of the channel portion 30*c*. The gate threshold voltage Vt of the P-type MOSFET is a negative voltage; and the gate threshold voltage Vt is reduced further by forming the N-type region. Accordingly, in the case of the P-type MOSFET, the concentration of the N-type impurity in the N-type region decreases as the fourth distance $L_{4A}$ shortens; and the gate threshold voltage Vt increases. In other words, in the fourth correlation, the absolute value |Vt| of the gate threshold voltage decreases as the fourth distance $L_4$ shortens. Thus, by changing the layout of the semiconductor element, the desired gate threshold voltage can be achieved without adding a new manufacturing process.

Figure 8:
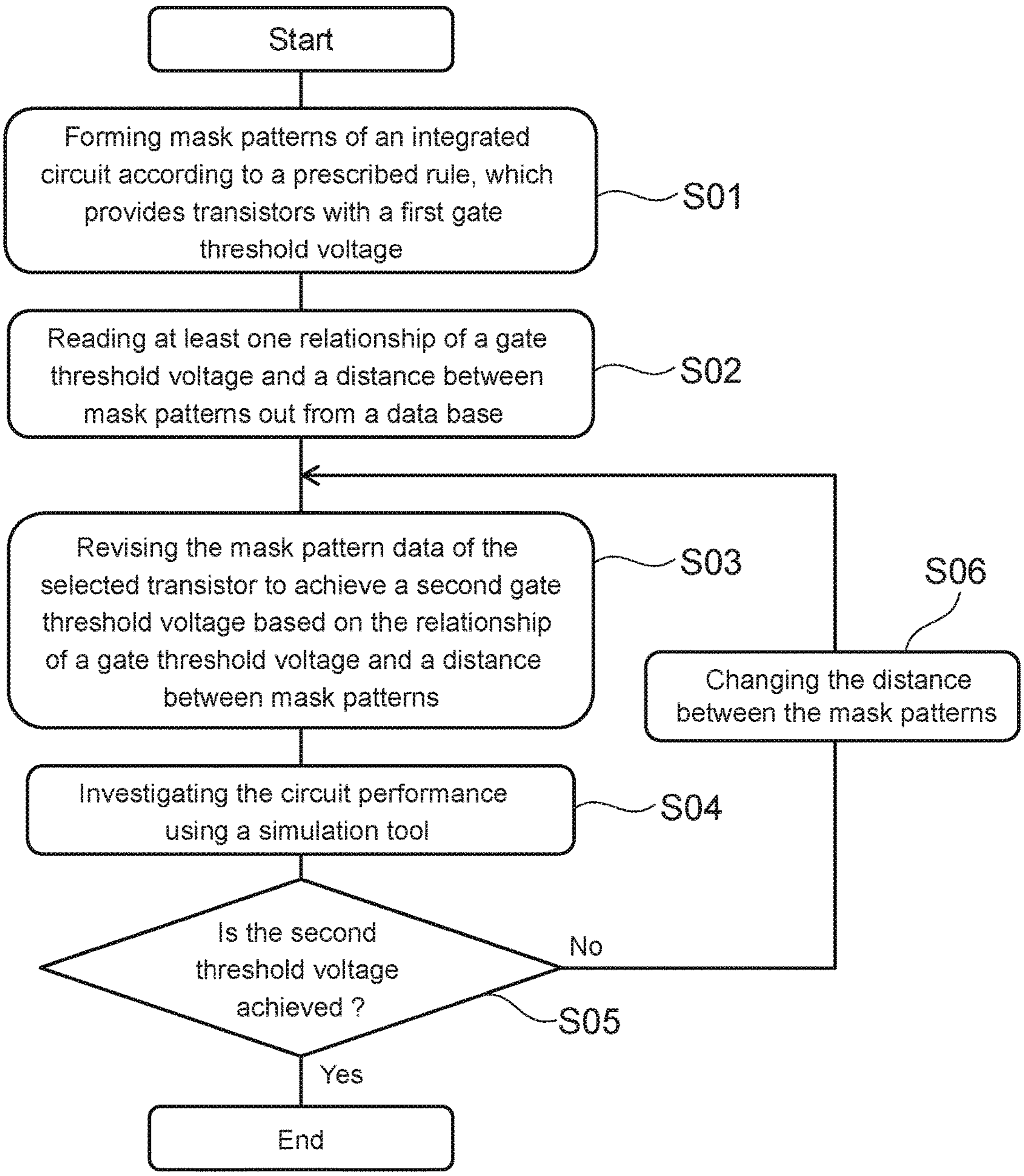
FIG. 8 is a flowchart showing a method for forming the mask pattern of an integrated circuit which includes the semiconductor element according to the first embodiment.

FIG. 8 is a flowchart showing a method for forming the mask pattern group according to the embodiment. The mask pattern group includes the well pattern 110*a*, the source/drain pattern 120*a*, the interconnect pattern 130*a*, and the ion implantation pattern 150*a* and is formed using, for example, a mask design tool including a processor that executes the following method.

Step S01: Mask patterns of an integrated circuit including multiple semiconductor elements 1 (hereinbelow, the N-type MOSFETs) are formed according to a prescribed design rule. For example, the first distance $L_1$, the second distances $L_{2A}$ and $L_{2B}$, and the third distance $L_3$ are set to sufficiently large values such that the gate threshold voltage Vt of the N-type MOSFET is determined, for example, by the surface concentration of the P-type impurity at the center of the P-type well 23. The P-type region 29 shown in FIG. 2G is not always formed, and is formed, for example, in the case where the gate length $L_{G1}$ is short and the gate threshold voltage Vt is lower than the desired value. In such a case, the fourth distances $L_{4A}$ and $L_{4B}$ are set so that the shadow region 153*s* does not overlap the gate portion 45 of the semiconductor element 1. Accordingly, the multiple N-type MOSFETs have the same first gate threshold voltage Vt1.

Step S02: At least one of the correlations of the gate threshold voltage Vt that are dependent on the distances between the mask patterns is acquired from a data base. For example, the data base stores the first correlation, the second correlation, the third correlation, and the fourth correlation; and the processor accesses the data base and reads at least one of the first correlation, the second correlation, the third correlation, or the fourth correlation.

Step S03: The mask pattern data is revised to obtain a second gate threshold voltage Vt2 for at least one N-type MOSFET selected from the multiple N-type MOSFETs. For example, at least one of the first distance $L_1$, the second distances $L_{2A}$ and $L_{2B}$, the third distance $L_3$, or the fourth distances $L_{4A}$ and $L_{4B}$ is reduced based on the correlation of the distance.

Step S04: The performance of the integrated circuit is verified based on the mask pattern data after the revision. For example, a circuit simulator is used in the performance verification of the integrated circuit.

Step S05: It is determined whether the second gate threshold voltage Vt2 is obtained or not based on the verified performance of the integrated circuit. For example, the gate threshold voltage Vt of the N-type MOSFET selected may be identified based on the verification result of the integrated circuit; and alternatively, it may be determined that the second gate threshold voltage Vt2 is obtained when the integrated circuit has the prescribed performance. Then, the mask pattern data is fixed when the second gate threshold voltage Vt2 is obtained; and the method ends.

Step S06: when the gate threshold voltage Vt2 is not obtained, the distances between the mask patterns are modified; and steps S03 to S05 are further executed. For example, at least one of the first distance $L_1$, the second distances $L_{2A}$ and $L_{2B}$, the third distance $L_3$, or the fourth distances $L_{4A}$ and $L_{4B}$ is increased or decreased based on the correlation of the distance.

Such a mask pattern formation method is an example; and the embodiment is not limited thereto. For example, the mask pattern of integrated circuit including the multiple N-type MOSFETs is designed in the step S01 so as to have different gate threshold voltages Vt by implementing the mask design based on the first correlation, the second correlation, the third correlation, and the fourth correlation, and then, an algorithm based on the first correlation, the second correlation, the third correlation, and the fourth correlation may be executed to obtain the desired gate threshold voltages Vt1 and Vt2.

According to the embodiments recited above, it is unnecessary to form wells having different surface concentrations to obtain multiple semiconductor elements having mutually-different gate threshold voltages; and the numbers of ion implantation processes and ion implantation masks can be reduced. Thereby, the manufacturing efficiency of the semiconductor device is increased; and the manufacturing cost may be reduced.

Second Embodiment

A manufacturing process of a semiconductor device 2 according to a second embodiment is described with reference to FIGS. 9A to 9D. FIGS. 9A to 9D are schematic cross-sectional views showing the manufacturing process of the semiconductor device 2. FIGS. 9A to 9D are cross-sectional views taken along A-A line shown in FIG. 1.

Figure 9A:
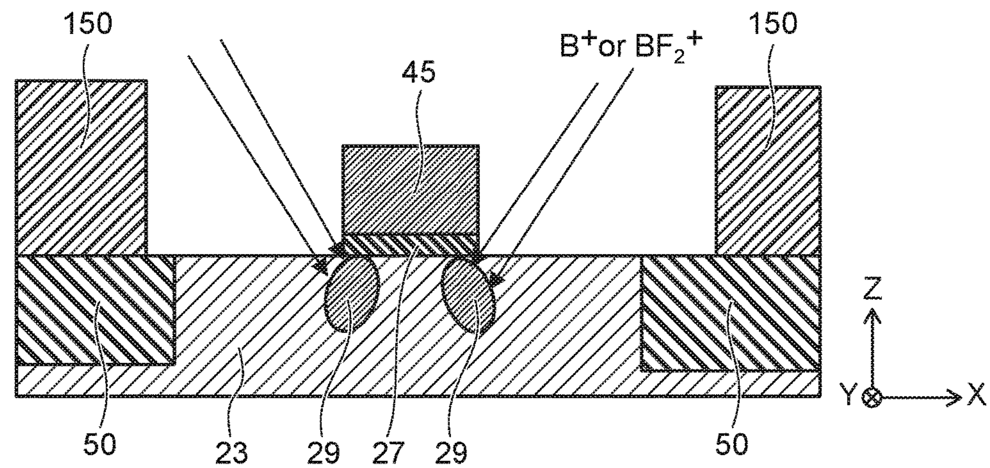
FIGS. 9A to 9D are schematic cross-sectional views showing a manufacturing process of a semiconductor device according to a second embodiment.

For example, after the insulating layer 27 and the gate portion 45 are formed on the P-type well 23 (see FIGS. 2A to 2D), P-type regions 29 are selectively formed under the gate portion 45 as shown in FIG. 9A. The P-type regions 29 are formed, for example, by oblique ion-implantation in which P-type impurities such as boron (B) or boron difluoride ($BF_2$) are implanted under the gate portion 45 with a large tilt angle "θ". This process is performed, for example, after the formation of the ion-implantation mask 150 on the STI 50. The ion implantation mask includes an opening 153 in which the gate portion 45 provided on the P-type well 23 is exposed.

Also, in this example, it is possible to adjust the gate threshold voltage by changing the impurity concentration in the P-type regions through the fourth correlation depending on the fourth distance L4A between the inner wall of the ion-implantation mask 150 and the outer edge of the source/drain region 33A or 33B adjacent thereto.

Figure 9B:
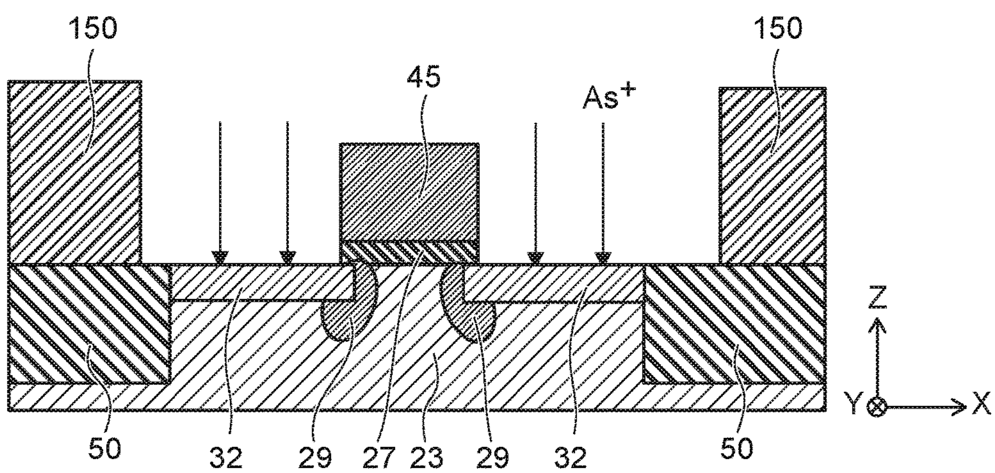

Then, extension regions 32 are formed on the top surface side of the P-type well 23 as shown in FIG. 9B. The extension regions 32 are formed on both sides of the gate portion 45 respectively by ion-implanting N-type impurities such as arsenic (As). In this case, the gate portion 45 serves as the ion-implantation mask so as to block N-type impurities directed to the portion thereunder.

Figure 9C:
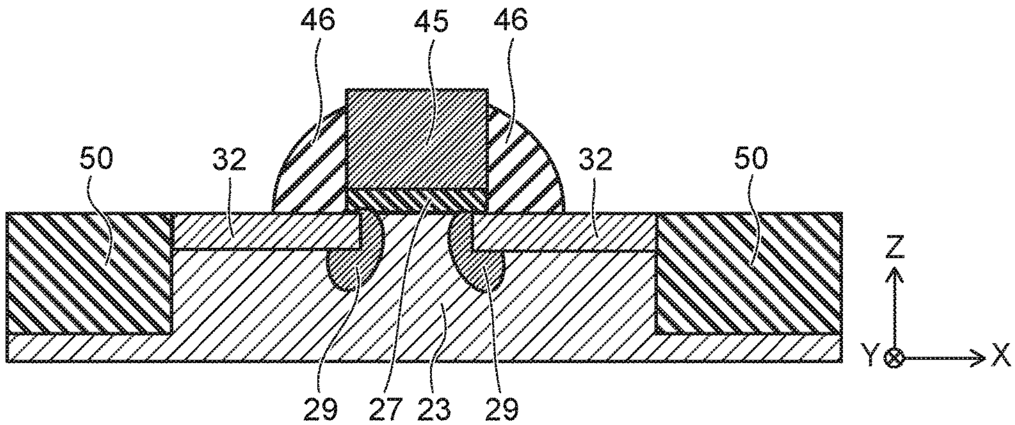

As shown in FIG. 9C, sidewalls 46 are formed on the lateral surfaces of the gate portion 45 respectively. The sidewalls 46 include, for example, silicon oxide. The sidewalls 46 are formed by removing a silicon oxide layer provided over the wafer using anisotropic RIE so as to leave portions provided on the lateral surfaces of the gate portion 45.

Figure 9D:
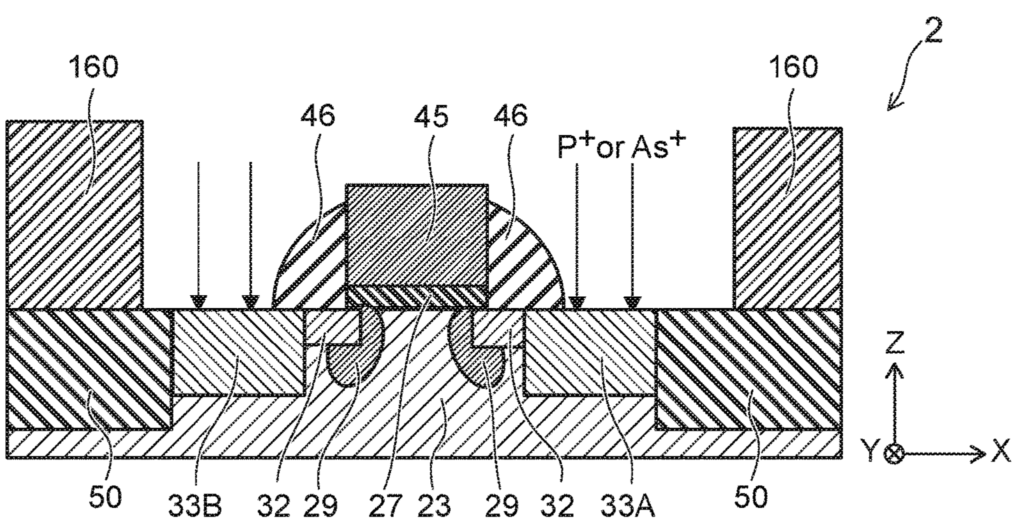

As shown in FIG. 9D, N-type source/drain regions 33A and 33B are formed on the top surface side of the P-type wall 23. The N-type source/drain regions 33A and 33B are selectively formed on the P-type well 23, for example, using an ion-implantation mask 160. The gate portion 45 and the sidewalls 46 also serve as the ion-implantation mask which blocks N-type impurities directed to a portion thereunder. Thus, Parts of the extension regions 32 are left under the sidewalls 46.

Then, the semiconductor device 2 is completed by forming the insulating layer 55, the contact plugs 65 and the interconnects 63 through the steps shown in FIGS. 2H to 2I. Also, in this embodiment, it is possible to reduce the ion-implantation steps and ion-implantation masks by designing mask patterns based on the first, second, third and fourth correlations, and thus, to achieve the semiconductor device including a plurality of semiconductor elements with gate threshold voltages different from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for forming a mask pattern of a semiconductor element, the method comprising:

forming a mask pattern group based on a prescribed rule for providing the semiconductor element with a first gate threshold voltage, the mask pattern group including:

a well pattern defining a first region on a semiconductor region;

an interconnect pattern defining an interconnect including a gate portion extending in a first direction on the first region; and a source/drain pattern defining a second region positioned in the first region, the gate portion crossing the second region in the first direction; and modifying the mask pattern group to change the first gate threshold voltage to a second gate threshold voltage based on a correlation between a gate threshold voltage and at least one of first to fourth distances in the semiconductor element, wherein the gate threshold voltage changes with an absolute change amount that increases as each of the first to fourth distances is shortened, the first distance being defined as a distance to an outer edge of the first region from an outer edge of the second region proximal to the outer edge of the first region;

the second distance being defined as a distance from the outer edge of the second region to the gate portion in a second direction crossing the first direction;

the third distance being defined as a distance to the second region from a portion of the interconnect positioned outside the second region in one of the first direction or the second direction; and the fourth distance being defined when the mask pattern group further includes an ion implantation pattern defining an opening of an ion implantation mask in which the second region is exposed, the fourth distance being a distance to a wall surface of the opening from the outer edge of the second region proximal to the wall surface of the opening.

2. The method according to claim 1, wherein the second distance is a distance to the gate portion from one outer edge of the second region in the second direction, when a distance to the gate portion from the other outer edge of the second region in the second direction is fixed.

3. The method according to claim 1, wherein the interconnect includes a first portion and a second portion, the first portion extending in the first direction and including the gate portion, the second portion extending in the second direction, and the third distance is a distance from the second portion to the second region.

4. The method according to claim 1, wherein the second region includes a first portion and a second portion, the first portion crossing the gate portion, the second portion extending in the first direction, and the third distance is a distance to the second portion of the second region from a portion of the interconnect extending in the first direction.

* * * * *